United States Patent
Byrne et al.

(10) Patent No.: US 6,681,332 B1
(45) Date of Patent: Jan. 20, 2004

(54) SYSTEM AND METHOD TO PLACE A DEVICE IN POWER DOWN MODES/STATES AND RESTORE BACK TO FIRST MODE/STATE WITHIN USER-CONTROLLED TIME WINDOW

(75) Inventors: Michael Byrne, Ballysheedy (IE); Nicola O'Byrne, Carrigaline (IE); Colin Price, Newbury (GB); Derek Hummerston, Newbury (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/523,610

(22) Filed: Mar. 13, 2000

(51) Int. Cl.$^7$ .................................................. G06F 1/32
(52) U.S. Cl. ....................................... 713/300; 713/300
(58) Field of Search ........................................... 713/300

(56) References Cited

U.S. PATENT DOCUMENTS

| | | | | |
|---|---|---|---|---|
| 4,291,300 A | * | 9/1981 | Bader | 341/157 |
| 4,387,449 A | * | 6/1983 | Masuda | 365/227 |
| 4,894,728 A | * | 1/1990 | Goodman | 360/6 |
| 5,428,664 A | * | 6/1995 | Kobayashi | 379/58 |
| 5,619,204 A | * | 4/1997 | Byrne et al. | 341/155 |
| 5,668,551 A | * | 9/1997 | Garavan et al. | 341/128 |
| 5,714,955 A | * | 2/1998 | Reay et al. | 341/155 |
| 5,890,799 A | * | 4/1999 | Yiu et al. | 713/321 |
| 5,914,681 A | * | 6/1999 | Rundel | 341/135 |
| 6,094,154 A | * | 7/2000 | Lee | 341/161 |
| 6,294,404 B1 | * | 9/2001 | Sato | 438/106 |
| 6,456,219 B1 | * | 9/2002 | Schreiber et al. | 341/155 |
| 6,473,607 B1 | * | 10/2002 | Shohara et al. | 455/343 |

FOREIGN PATENT DOCUMENTS

EP          606727 A1 * 7/1994 ......... H03K/19/003

OTHER PUBLICATIONS

AD7887 Micropower, 2–Channel, 125 kSPS, 12–bit ADC Data Sheet, Analog Devices, Inc., Revision B, Sep. 1999.
LTC1400 Complete SO–8, 12–bit, 400 ksps ADC Data Sheet, Linear Technology Corporation, May, 1997.

* cited by examiner

Primary Examiner—Thomas M. Heckler
Assistant Examiner—Nitin Patel
(74) Attorney, Agent, or Firm—Wolf, Greenfield & Sacks, P.C.

(57) ABSTRACT

A method for placing a device in a reduced power-consumption mode of operation. The method comprises the steps of initializing a device select signal into a first logic state, asserting the device select signal in a second logic state, and returning the device select signal to the first logic state within a first predetermined time window. A device is also described that includes means for detecting logic state transitions at a device select input and a clock input, and means for changing operating mode of the device in response to a predetermined number of logic state transitions at the clock input, occurring between logic state transitions at the device select input.

26 Claims, 6 Drawing Sheets

SYSTEM AND METHOD TO PLACE A DEVICE IN POWER DOWN MODES/STATES AND RESTORE BACK TO FIRST MODE/ STATE WITHIN USER-CONTROLLED TIME WINDOW

FIELD OF THE INVENTION

This invention relates generally to serial communication interfaces and in particular to unidirectional serial communication, and is more particularly directed toward utilizing a read-only serial interface to place a device in a power-down mode.

BACKGROUND OF THE INVENTION

The popularity of battery-operated equipment, and the demand for smaller devices with longer periods between battery replacement or recharging, has given rise to a need for reducing power consumption in the devices used in such equipment. One technique that has been developed involves supplying full power to a device during periods of so-called "normal" operation, and placing the device in a low power consumption mode (sometimes referred to as "inactive," "power down," or "sleep" mode) during intervening non-operating periods.

U.S. Pat. No. 5,619,204 describes an analog-to-digital converter (ADC) with optional low power mode that is controlled by monitoring the state of a "conversion start" (CONVST) signal with respect to the conversion completion point. U.S. Pat. No. 5,714,955 ('955 Patent) describes dual function control circuitry for effecting the switchover between operating modes of a serial ADC. The control signals used to trigger this switchover between operating modes are signals associated with the conversion process and not with the serial data transfer.

FIG. 1 is a block diagram of an ADC of the prior art (generally depicted by the numeral 100) that is configured for power-down mode control. A CLK (clock) signal 101 is used to synchronise the conversion operation, and a CONV (conversion) signal 102 is used to initiate the conversion operation. The CLK 101 and CONV 102 signals are provided as inputs to internal control logic 103 that controls operation of the SAR (successive approximation register) and parallel to serial converter logic 104. The serial output data 108 of the device 100 is derived by shifting out the SAR contents serially after the conversion is complete.

The CLK 101 and CONV 102 signals also serve to produce power-down and power-up commands. They thus serve as dual-function pins. However, these signals do not produce these power-up and power-down commands when operating in the usual manner across the serial interface. The manner in which these signals must be asserted with respect to each other is not easily configured over a standard serial interface, and cannot provide power-down and power-up commands when standard serial communication is taking place. Instead, the signals are asserted as shown in the timing diagram of FIG. 2.

When CLK 201 is low, two CONV 202 pulses command the ADC to enter a first power-down mode, in this case a reduced power consumption mode denominated the NAP mode 203. When CLK 201 remains low, two additional CONV 202 pulses are required to place the part in a second power-down mode, in this case the SLEEP mode 204, consuming even less power than the NAP mode 203. The timing of CONV and CLK are not easily generated over a standard serial interface with a microcontroller, and are not available from a DSP in the manner required.

The closest known practice exists in a family of serial ADCs manufactured by Analog Devices, Inc. Shutdown is controlled via the state of "chip select" (CS) when the device is in read-only mode. When CS is low, the device is fully powered up, and when CS is high the device is fully powered down. This means that shutdown is enforced after each conversion, and so the required power-up time must be allowed before each conversion, slowing down the overall throughput of the device.

Conventional ADC circuits typically use a dedicated input in order to implement a power-down function. This requirement for a dedicated input increases the number of lines in the chip package.

Consequently, a need arises for a power-down mode implementation that does not require a dedicated input or complex, multi-line protocol, and does not interfere with device throughput.

SUMMARY OF THE INVENTION

These shortcomings of the prior art, and others, are addressed using the shut-down mode programming of the present invention. The read-only serial interface can be used to place an ADC or other integrated circuit device in one or more power-down modes without writing to a control register or using a dedicated shut-down pin. This involves monitoring the state of CS with respect to the system clock (SCLK). After the falling edge of CS, shut-down is detected by checking the point where CS returns to a logic high during the following burst of 16 SCLKs. Subsequent power-up is detected in the same way.

Three modes of operation are provided. These are the Fully-Powered Mode, Partial Power-Down Mode, and Full Power-Down Mode. In the Fully-Powered Mode, all portions of the device are fully powered at all times, so this mode of operation yields fastest device throughput but increased power consumption.

In the Partial Power-Down Mode of operation, power is removed from most portions of the device except when a conversion has been initiated. The Partial Power-Down Mode requires an extra conversion cycle for the first conversion performed, so device throughput is reduced in return for reduced power consumption.

In Full Power-Down Mode, all analog circuitry on the device is powered down. This mode of operation is intended for applications in which power conservation is of the utmost importance. Device throughput is relatively low in Full Power-Down Mode, primarily because of the extended time periods required both to place the device in Full Power-Down and to "wake it up" again.

In accordance with the invention, a method is provided for placing a device in a reduced power-consumption mode of operation. The method comprises the steps of initializing a device select signal into a first logic state, asserting the device select signal in a second logic state, and returning the device select signal to the first logic state within a first predetermined time window. In one form of the invention, the step of initializing a device select signal further comprises the step of placing the device select signal into an inactive logic state. The inactive logic state may comprise a HIGH logic state. The step of asserting the device select signal further comprises the step of placing the device select signal into an active logic state, which may comprise a LOW logic state.

In one form of the invention, the device includes a clock signal input and the step of returning the device select signal to the first logic state within a first predetermined time window further comprises the step of returning the device select signal to the first logic state after the occurrence of a first transition of the clock signal, but before the occurrence of a second subsequent transition of the clock signal. The first transition of the clock signal preferably comprises the second falling edge of the clock signal that occurs after assertion of the device select signal in a second logic state, while the second subsequent transition of the clock signal comprises the tenth falling edge of the clock signal that occurs after assertion of the device select signal in a second logic state.

In accordance with another aspect of the invention, the device is restored to fully-powered mode by the additional steps of asserting the device select signal in the second logic state, and returning the device select signal to the first logic state within a second predetermined time window. The second predetermined time window is defined by at least ten falling edges of the clock signal.

In accordance with yet another aspect of the invention, a method is provided for placing an integrated circuit device having a chip select (CS) input and a clock (CLK) input into a reduced power consumption mode of operation. The method comprises the steps of controlling the CS input of the device to place the CS input into an initial inactive logic state, placing the CS input into an active logic state to select the device, and, within a first predetermined time window defined by transitions of the CLK signal, returning the CS input to the initial inactive logic state. The initial inactive logic state may be a HIGH logic state, while the active logic state may be a logic LOW state.

In accordance with a further aspect of the invention, the first predetermined time window defined by transitions of the CLK signal comprises a time window beginning with the second falling edge of the CLK signal that occurs after CS is placed in an active logic state, and ending with the tenth subsequent falling edge of the CLK signal that occurs while CS is in the active logic state. In one form of the invention, the device is restored to fully-powered mode by the additional steps of placing the CS input into the active logic state to select the device, and, within a second predetermined time window defined by transitions of the CLK signal, returning the CS input to the initial inactive logic state. Preferably, the second predetermined time window is defined by at least ten falling edges of the CLK signal.

In accordance with another embodiment of the invention, a device comprises means for detecting logic state transitions at a device select input and a clock input, and means for changing operating mode of the device in response to a predetermined number of logic state transitions at the clock input, occurring between logic state transitions at the device select input. In one form of the invention, the means for detecting logic state transitions at a device select input and a clock input further comprises clock divide logic and counter circuitry coupled to the serial clock signal and the device select signal, the clock divide logic and counter circuitry generating intermediate control signals including a first intermediate control signal that occurs after the second falling edge of the serial clock signal and a second intermediate control signal that occurs after the tenth falling edge of the serial clock signal.

In another aspect of the present invention, the means for changing operating mode of the device places the device in a reduced power consumption mode of operation in response to a first combination of logic state transitions, and restores the device to fully-powered operation in response to a second combination of logic state transitions. The first combination of logic state transitions comprises between two and ten logic state transitions at the clock input, occurring between logic state transitions at the device select input, while the second combination of logic state transitions comprises at least ten logic state transitions at the clock input, occurring between logic state transitions at the device select input.

In accordance with yet another aspect of the invention, an analog-to-digital converter comprises means for converting an analog input signal into a corresponding digital signal in response to a control signal, means for outputting the corresponding digital signal in serial form in response to a serial clock signal, means for generating at least one command signal in response to a number of serial clock signal cycles occurring between changing states of the control signal, and means for applying power to selected portions of the analog-to-digital converter in response to the command signal.

In yet a further aspect of the invention, the means for converting an analog input signal into a corresponding digital signal further comprises a track and hold circuit coupled to the analog input signal, and a successive approximation ADC coupled to the track and hold circuit. The means for outputting the corresponding digital signal further comprises a successive approximation register, a data multiplexer coupled to the successive approximation register and the serial clock signal, and a serial data output coupled to the data multiplexer.

In another form of the invention, the means for generating at least one command signal further comprises clock divider and counter logic coupled to the serial clock signal and the control signal, wherein the clock divider and counter logic generates a plurality of command signals conditioned, at least in part, by the number of serial clock signal cycles occurring between changing states of the control signal. The means for applying power to selected portions of the analog-to-digital converter further comprises control and power management logic coupled to the control signal and the clock divider and counter logic.

Further objects, features, and advantages of the present invention will become apparent from the following description and drawings.

DETAILED DESCRIPTION OF THE INVENTION

In accordance with the present invention, a read-only serial interface is used to place an integrated circuit device in a power-down mode. The present invention provides distinct advantages when compared to power-down methodologies known in the art.

Figure 1:
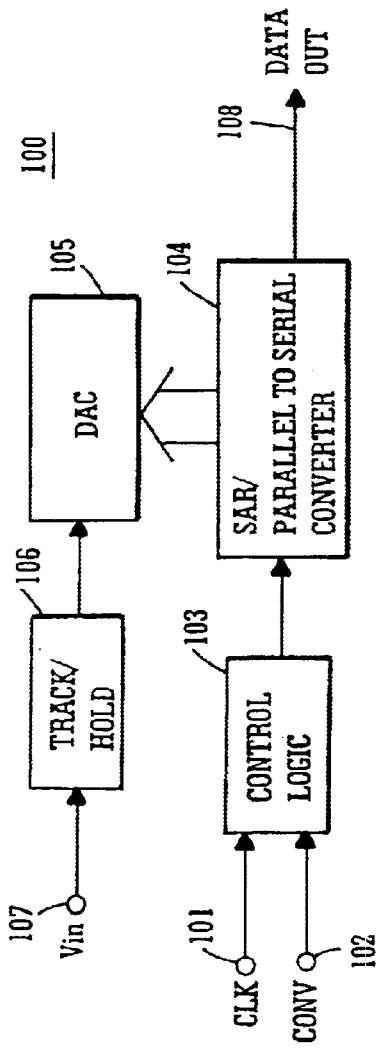
FIG. 1 is a block diagram of a prior art device that is configured for shut-down mode control.
Figure 2:
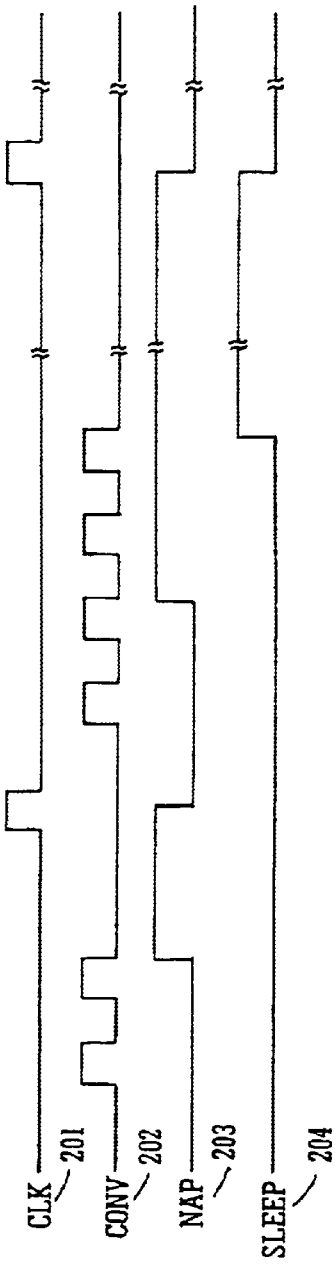
FIG. 2 is a timing diagram that illustrates the operating modes of the prior art device of FIG. 1.
Figure 3:
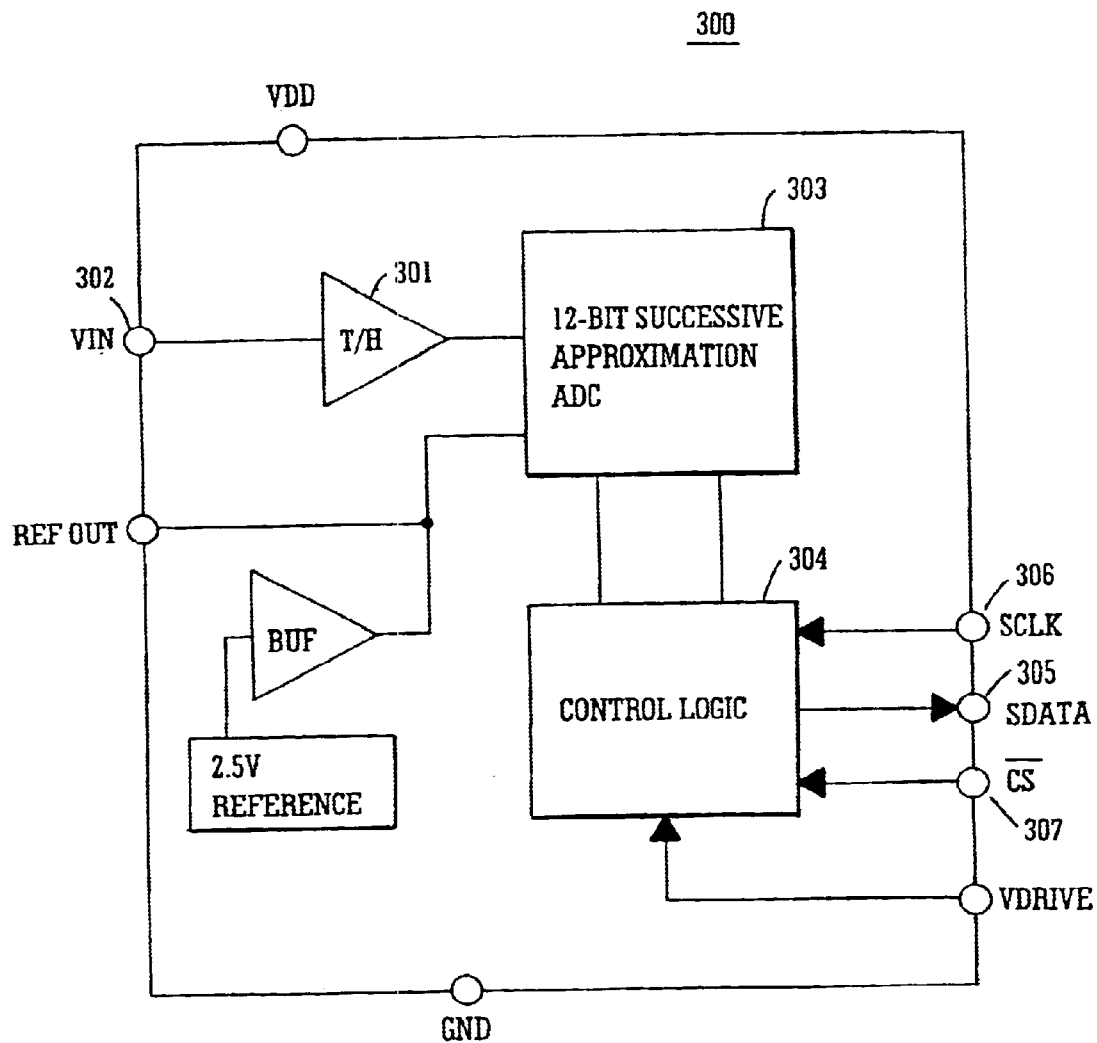
FIG. 3 is a simplified block diagram of a device having operating mode control in accordance with the present invention.

An example of an ADC integrated circuit having operational mode control in accordance with the present invention is shown in simplified block diagram form in FIG. 3 and generally depicted by the numeral 300. The ADC 300 includes a track and hold circuit 301 for acquiring an analog input voltage 302. A 12-bit successive approximation register (SAR) ADC 303 converts the analog input signal 302 into a corresponding digital signal. The integrated circuit 300 includes control logic 304 that controls the operation of the other components of the integrated circuit 300, and also includes power control circuitry for selectively applying/removing power from portions of the device, although this power control circuitry is not illustrated in the simplified block diagram of FIG. 3.

The control logic 304 also functions as a conversion circuit for outputting the corresponding digital signal in serial form (SDATA) 305 in response to a serial clock input (SCLK) 306. The control logic 304 further includes a monitoring circuit that generates internal control signals in response to the number of SCLK cycles occurring between states of the chip select (CS) input signal 307. These internal control signals control power-down mode operation, and will be discussed in more detail subsequently.

Figure 4:
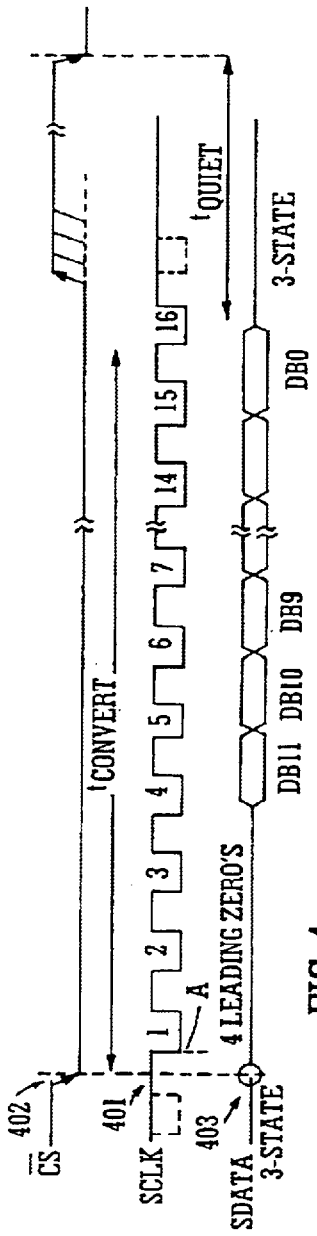
FIG. 4 is a timing diagram that illustrates serial communication with the device of FIG. 3.

FIG. 4 is a detailed timing diagram illustrating serial communication with the ADC 300 of FIG. 3. The serial clock SLK 401 provides the conversion clock and also controls the transfer of information from the ADC 300 during conversion. CS (chip select) 402 initiates the data transfer and conversion processes. The falling edge of CS 402 puts the track and hold into hold mode, takes the SDATA output 403 out of the high impedance state, and the analog input is sampled at this point. The conversion is also initiated at this point, and requires 16 SCLK 401 cycles to complete. It should be noted that the SDATA output 403 is in a high impedance, "third" logic state when the ADC 300 is not performing a conversion, and also when the device has completed a serial data transfer. This third logic state is sometimes called "3-state," there being three possible conditions: logic HIGH, logic LOW, and high impedance.

On the 16th SCLK 401 falling edge, the SDATA (serial data) line 403 goes back into 3-state. If the rising edge of CS occurs before 16 SCLK active edges have occurred, the conversion is terminated and the SDATA line goes back into 3-state, otherwise SDATA returns to 3-state on the 16th SCLK falling edge as shown. Sixteen serial clock cycles are required to perform the conversion process and to access data from the ADC 300.

While the active edge of SCLK 401 is the falling edge, or the HIGH-to-LOW logic transition, in the preferred form of the invention, a system could easily be configured to employ either the falling or rising edge of SCLK as the active edge. Similarly, in the preferred embodiment of the invention, the CS signal 402 selects the ADC 300 when CS 402 is in a LOW logic state, but an ADC 300 in accordance with the present invention could also be made responsive to a HIGH logic level on CS 402 if design considerations so dictated.

The first serial clock falling edge following CS going low (point A) provides the first leading zero to be read in by the microcontroller or DSP that interfaces with the ADC 300. This SCLK falling edge also clocks out the second leading zero, thus the second falling clock edge on the serial clock has the second leading zero provided. The final bit in the data transfer is valid on the sixteenth falling edge, having been clocked out on the previous (15th) falling edge. In applications with a slower SCLK, it may be possible to read in data on each SCLK rising edge, i.e., the first rising edge of SCLK after the CS falling edge would provide the first leading zero, and the 15th rising SCLK edge would provide data bit zero (DB0).

There are three possible modes of operation: Fully-Powered Mode, Partial Power-Down Mode, and Full Power-Down Mode. The point at which CS is pulled high after the conversion has been initiated, combined with the previous operating mode, determines which of the three operating modes the device will assume.

These modes of operation are designed to provide flexible power management options. These options can be chosen to optimize the power dissipation/throughput rate ratio for differing application requirements. Choosing the mode of operation can be done with either a standard 8 SCLK burst or a standard 16 SCLK burst from a microcontroller. Of course, depending upon the capabilities of a particular microcontroller to accommodate multiple-byte serial data transfers, two standard 8 SCLK bursts or a single 16 SCLK burst may be required. If a DSP is used to provide the interface to the ADC 300, the DSP can be programmed to provide a SCLK burst of any desired length.

Figure 5:
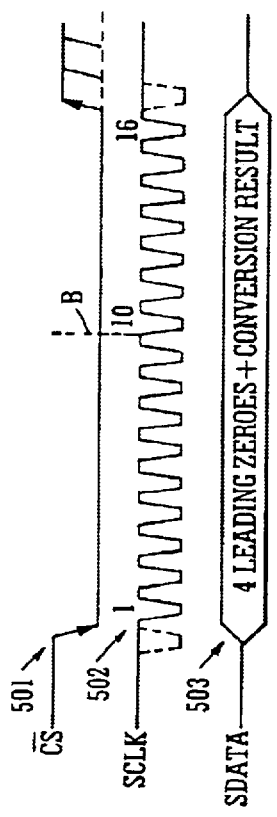
FIG. 5 is a timing diagram depicting fully-powered mode for the device of FIG. 3.

The fully-powered mode of operation is intended for fastest throughput rate performance, as the user does not have to worry about any power-up times (the ADC 300 remains fully powered all the time). FIG. 5 is a timing diagram that depicts the ADC 300 in its fully-powered mode of operation. A conversion is initiated on the falling edge of CS as described previously. To ensure the ADC 300 remains fully powered up at all times, CS 501 must remain low until at least 10 SCLK 502 falling edges have occurred after the falling edge of CS 501. The 10th SCLK 502 occurs at point B of FIG. 5.

If CS 501 is brought high any time after the 10th SCLK 502 falling edge, the ADC 300 will remain powered up. If fewer than 16 SCLK 502 falling edges have elapsed when CS 501 is brought high, the conversion will be terminated and SDATA 503 will go back into 3-state. If 16 or more SCLK 502 falling edges are applied to the ADC 300 while CS 501 is low, then the conversion will terminate on the 16th SCLK 502 falling edge, putting SDATA 503 back into 3-state at this point. Sixteen serial clock cycles 502 are required to complete the conversion and access the conversion result. (CS 501 may idle HIGH until the next conversion, or may idle LOW until sometime prior to the next conversion, effectively idling CS LOW). Once a data transfer is complete (SDATA 503 has returned to 3-state), another conversion can be initiated after the quiet time, $t_{quiet}$, has elapsed by bringing CS 501 LOW again from its previous HIGH logic state.

The Partial Power-Down Mode is intended for use in applications where slower throughput rates are required. Either the ADC 300 is powered down between each conversion, or a series of conversions may be performed at a high throughput rate and then the ADC 300 is powered down for a relatively long duration between these bursts of several conversions. When the ADC 300 is in partial power-down, all analog circuitry is powered down except for the on-chip reference and reference buffer.

Figure 6:
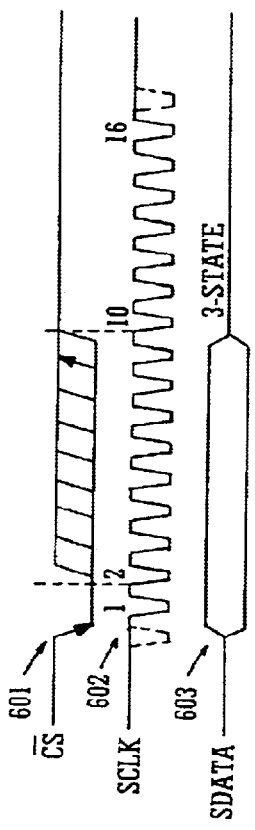
FIG. 6 is a timing diagram that illustrates entry into partial power-down mode for the device of FIG. 3.

To enter Partial Power-Down Mode from Fully-Powered Mode, the conversion process must be interrupted by bringing CS 601 high anywhere after the second falling edge of SCLK 602 and before the tenth falling edge of SCLK 602 as shown in the timing diagram of FIG. 6. Once CS 601 has been brought high in this window of SCLKs, then the ADC 300 will enter partial power-down, the conversion that was initiated by the falling edge of CS 601 will be terminated, and SDATA 603 will go back into 3-state. If CS 601 is brought high before the second SCLK 602 falling edge, then the ADC 300 will remain in Fully-Powered Mode and will not power down. This will avoid accidental power-down due to glitches on the CS line.

Figure 7:
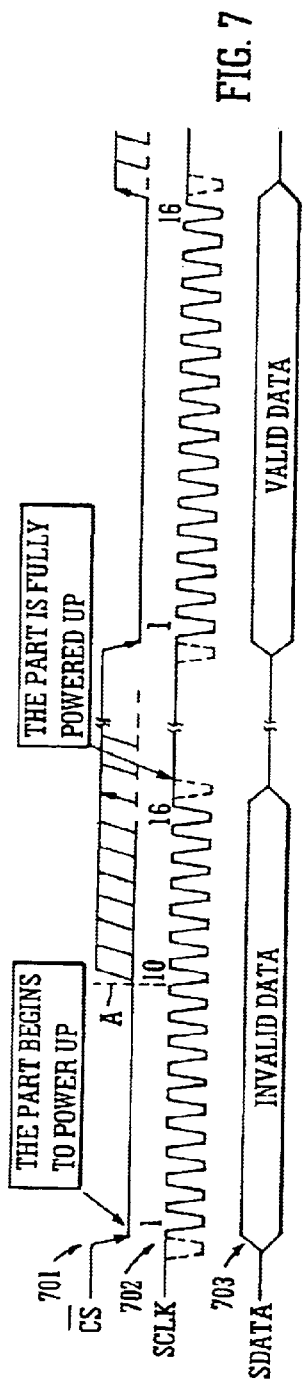
FIG. 7 is a timing diagram that shows the transition from power-down mode to fully-powered operation for the device of FIG. 3.

A dummy conversion is performed in order to exit this partial power-down mode of operation and power the ADC 300 up again, as shown in FIG. 7. On the falling edge of CS 701, the ADC 300 will begin to power up and will continue to power up as long as CS 701 is held low until after the falling edge of the tenth SCLK 702, as shown at point A. The device will be fully powered up once 16 SCLKs 702 have occurred, and valid data 703 will result from the next conversion. If CS 701 is brought high before the second falling edge of SCLK 702, then the device will go back into partial power-down mode again. This avoids accidental power-up due to glitches on the CS line. Even though the device may begin to power up on the falling edge of CS 701, it will power down again on the rising edge of CS 701 if the rising edge of CS 701 occurs before the second falling edge of SCLK 702. If the ADC 300 is in partial power-down mode before CS 701 is brought low, and CS is subsequently brought high between the second and tenth falling edges of SCLK, then the device will enter Full Power Down.

The Full Power-Down Mode is intended for use in applications where even slower throughput rates are required than those appropriate for Partial Power-Down Mode, as power-up from a full power-down would not be completed in one dummy conversion alone. This mode is more suited to applications where a series of conversions performed at a relatively high throughput rate would be followed by a long period of inactivity and hence power-down. When the ADC 300 is in full power-down, all analog circuitry is powered down.

Figure 8:
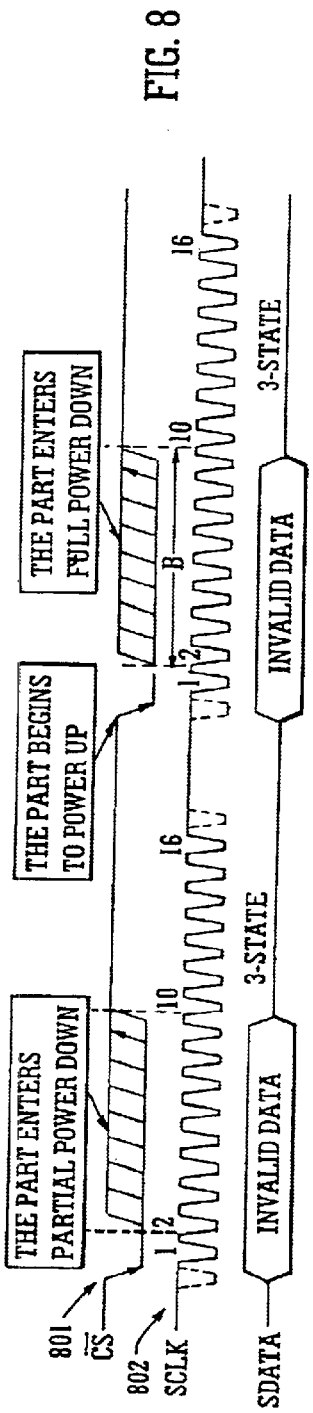
FIG. 8 is a timing diagram that depicts entry into full power-down mode for the device of FIG. 3.

Full Power-Down is entered in a way similar to partial power down, except the timing sequence depicted in FIG. 6 must be executed twice, as depicted in the timing diagram of FIG. 8. The conversion process must be interrupted in a similar fashion by bringing CS 801 high anywhere after the second falling edge of SCLK 802 and before the tenth falling edge of SCLK. The device will enter partial power-down at this point. To reach full power down, the next conversion cycle must be interrupted in the same way. Once CS 801 has been brought high in this window of SCLKs (interval B), then the ADC 300 will power down completely. It is not necessary to complete the 16 SCLKs 802 once CS 801 has been brought high to enter a power-down mode.

Figure 9:
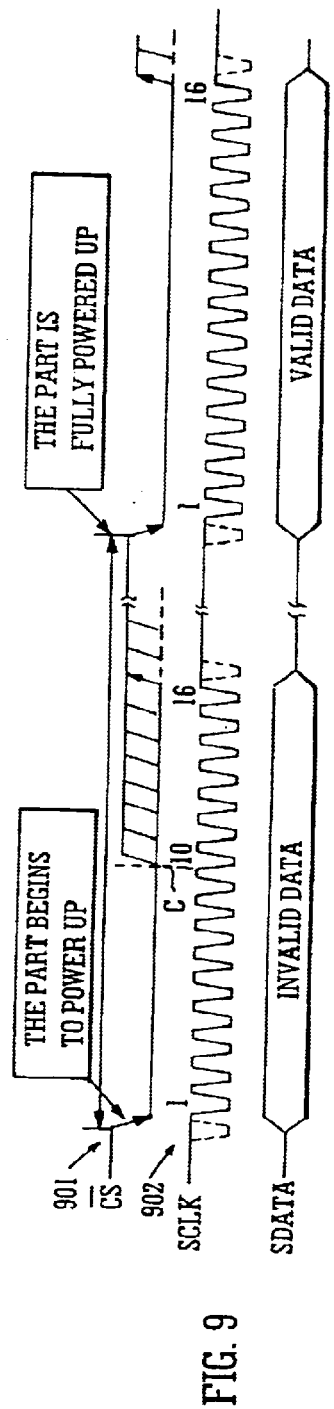
FIG. 9 is a timing diagram that illustrates the transition from full power-down mode to fully-powered operation for the device of FIG. 3.

To exit Full Power-Down and power the ADC 300 up again, a dummy conversion is performed just as when powering up from partial power-down. The exit from full power-down mode is shown in the timing diagram of FIG. 9. On the falling edge of CS 901, the device will begin to power up, and will continue to power up as long as CS 901 is held low until after the falling edge of the tenth SCLK 902, which occurs at point C. The power-up time is longer than one dummy conversion cycle, however, and this time must elapse before a conversion can be initiated once again.

Figure 10:
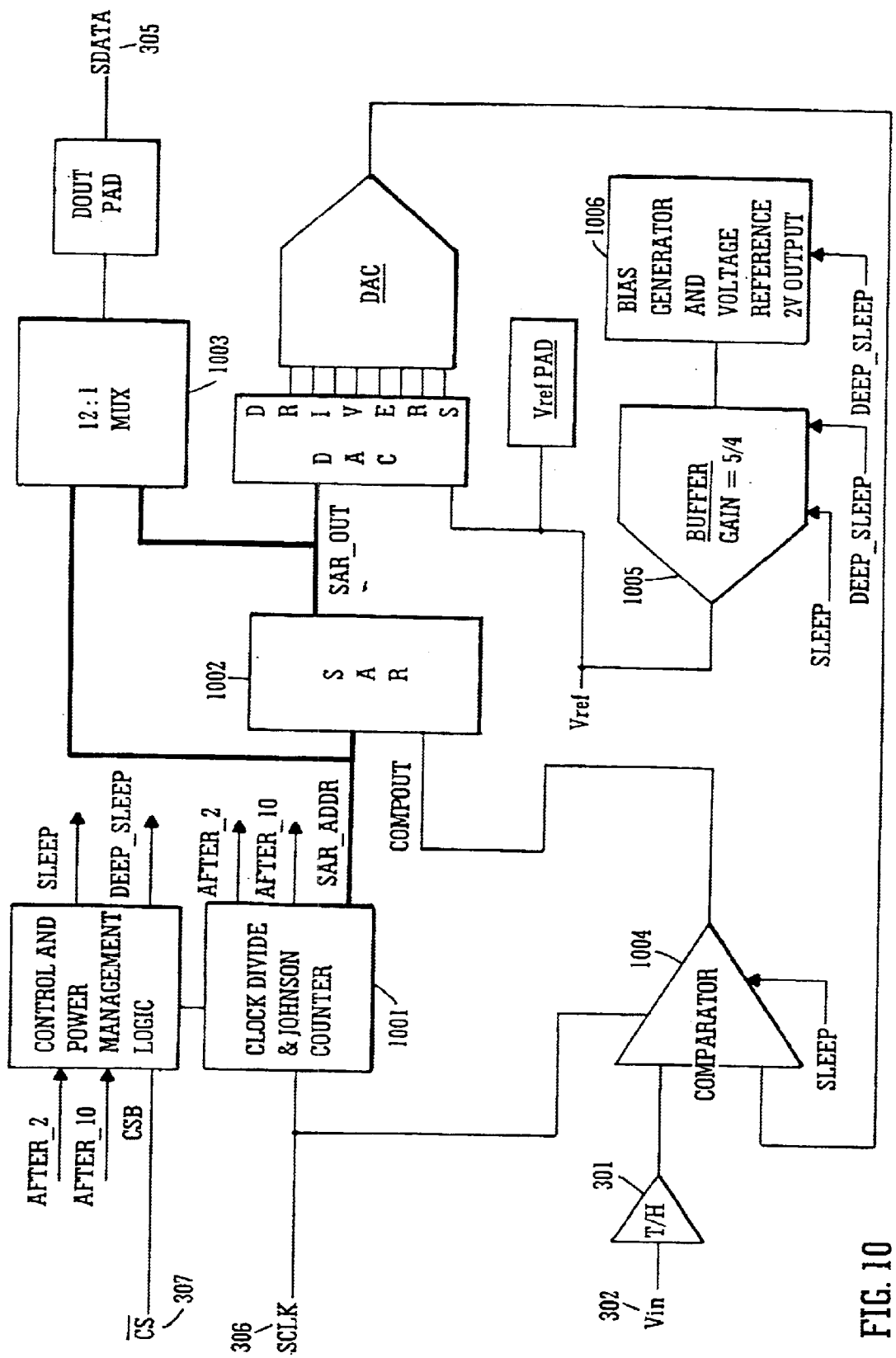
FIG. 10 is a detailed block diagram of the ADC illustrated in FIG. 3.

FIG. 10 is a detailed block diagram of the ADC illustrated in FIG. 3. The ADC 300 uses a successive-approximation architecture based on 16 SCLK pulses, active on the falling edge. A conversion is initiated by CS 307 going LOW, which puts the ADC 300 into hold. The bit trials are driven by SCLK, which drives a Johnson Counter 1001. The Johnson Counter 1001 performs two duties. It must control both the bit trials and the serial data output by addressing the SAR 1002 and the 12:1 data output multiplexer 1003 respectively.

The bit trials commence on the 2nd falling edge of SCLK 306, which decides the most significant bit, or MSB (DB11), and finish on the LSB (DB0) decision on the 13th falling edge. SCLK 306 also provides the edges required for clocking out the serial data 305. The first four SCLKs clock out leading zeroes, followed by the MSB value and so on through to the LSB.

Figure 11:
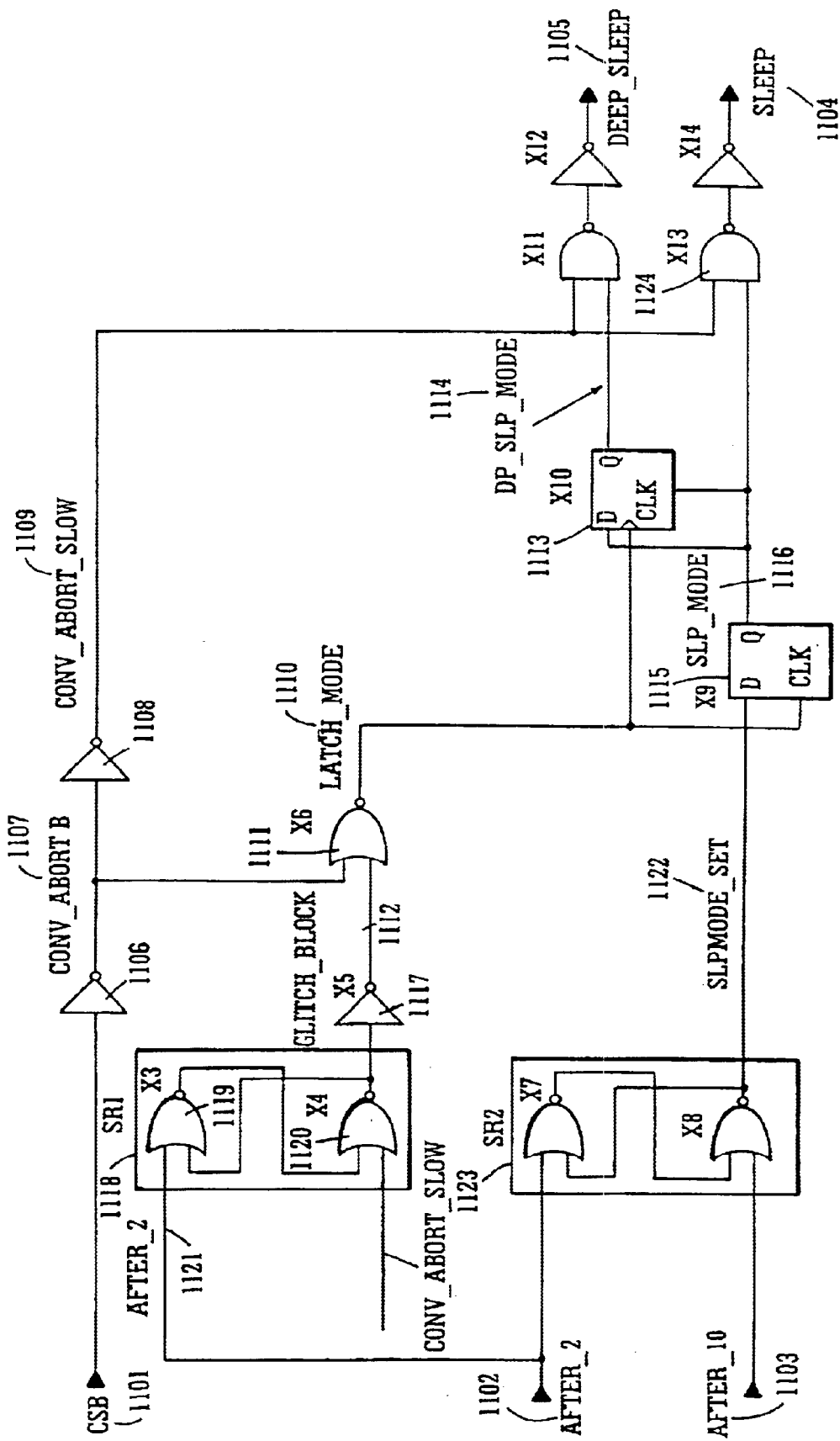
FIG. 11 is a logic diagram that illustrates the generation of internal control signals.

Generation of internal control signalling is depicted in FIG. 11. Signal csb 1101 is the start conversion signal. A falling edge on csb 1101 initiates a conversion, and if the conversion is not complete when this line goes HIGH it will be aborted. The system clock (SCLK) clocks a counter (not shown) that counts the number of falling edges on SCLK after csb 1101 has been taken LOW. After two such clock edges, the signal after_2 1102 goes HIGH for one SCLK cycle before going LOW again on the 3rd clock edge. The signal after_10 1103 is similarly set after ten SCLK edges during a conversion, and is cleared on the eleventh falling edge of SCLK.

There are two outputs from the control signal generating logic. The sleep signal 1104, when HIGH, shuts down the comparator 1004 (FIG. 10) and puts the reference buffer 1005 into a low current mode. This is partial power-down. A full shut-down is achieved when all the analog circuitry, including the bias generator 1006, is shut down. This happens when both sleep 1104 and deep_sleep 1105 are driven HIGH. When both deep_sleep 1105 and sleep 1104 are LOW, then the ADC 300 is fully powered up. The ADC 300 is never in a power-down mode during a conversion. It can only enter a power-down mode by aborting a conversion in progress.

csb 1101 is inverted once by inverter x1 1106 to become conv_abortb 1107. conv_abortb 1107 is inverted by x2 1108 to become conv_abort_slow 1109. conv_abort_slow 1109 is used primarily to force the signals deep_sleep 1105 and sleep 1104 LOW when csb 1101 is itself LOW. This means that when csb 1101 goes LOW, which starts a conversion, the ADC 300 is always powered up, regardless of any mode that it was in previously. The new sleep mode only takes effect when conv_abort_slow 1109 goes HIGH. The power-down mode that the ADC 300 will enter is selected when csb 1101 is brought HIGH during a conversion. This corresponds to a falling edge on conv_abortb 1107.

The signal conv_abortb 1107 changes the current power-down mode by setting the signal latch_mode 1110, the output of NOR gate x6 1111. latch_mode 1110 will only be permitted to go HIGH if the signal glitch_block 1112 is LOW. When latch_mode 1110 goes HIGH, the flip-flop x10 1113 will update its output Q, dp_slp_mode 1114, and the latch x9 1115 will store its current D input value at its output Q, slp_mode 1116.

The signal glitch_block 1112 is required to prevent the ADC 300 from entering a different power-down mode due to glitches on csb 1101. The glitch protection circuit is made up of inverter x5 1117 driven by S-R latch SR1 1118. SR1 1118 is implemented by cross-connected NOR gates x3 1119 and x4 1120. The SET signal of the S-R latch, after_2 1121, is normally LOW: it goes HIGH when a conversion is started (csb 1101 LOW), and two SCLK falling edges have been recognized by the ADC 300. after_2 1121 goes LOW again on the third SCLK falling edge. A HIGH signal on after_2 1121 causes the S-R latch output to be SET, which causes glitch_block 1112 to go LOW via inverter x5 1117. At this point, the signal latch_mode 1110 is no longer held LOW by x6 1111, but is allowed to go HIGH when conv_abortb 1107 goes HIGH, clocking the latch x9 1115 and flip-flop x10 1113.

Until glitch_block 1112 goes low, a glitch on csb 1101 that causes it to go momentarily HIGH then LOW (i.e., HIGH then LOW within two SCLK active edges), mimicking an aborted conversion, will not cause the power management mode to be changed in error, as the storage elements x9 1115 and x10 1113 will see no change to their clk inputs. When csb 1101 goes HIGH to signal the end of a conversion, conv_abort_slow 1109 will go HIGH, which resets the S-R latch SR1 1118, ensuring that further glitches do not cause the ADC to enter the wrong mode.

The latch output slpmode_set 1122 determines which mode the ADC 300 should enter the next time csb 1101 is brought HIGH. If slpmode_set 1122 is 0 then the ADC will remain powered up at the end of conversion. If slpmode_set 1122 is 1, then the ADC 300 will enter one of its two sleep modes, depending on the previous mode before a conversion was initiated. The value of slpmode_set 1122 is determined by the two signals after_2 1102 and after_10 1103 via S-R latch SR2 1123. If a conversion is started and two SCLK signals have been recognised by the ADC 300, then the signal after_2 1102 will go HIGH on the second falling edge of SCLK for one clock cycle, setting the output of SR2 1123. SR2 1123 will remain set until the signal after_10 1103 has gone HIGH to reset it. After_10 1103 will go HIGH for one clock cycle when the ADC 300 has counted ten SCLK falling edges inside a csb LOW pulse. This will cause the value of slpmode_set 1122 to go HIGH.

The signals slp_mode 1116 and dp_slp_mode 1114 remember which mode the ADC 300 was in just before csb 1101 started a new conversion. As explained, slp_mode 1116 and dp_slp_mode 1114 are prevented by the glitch blocking circuitry from changing the power management mode, until after the second clock pulse within a conversion has been recognised by the ADC 300. If more than two SCLK edges have elapsed within a conversion, then the glitch rejection circuitry is disabled and the interface is free to change the power-down mode when csb 1101 is brought HIGH. Both storage elements x9 1115 and x10 1113 are clocked by the rising edge on latch_mode 1110 when csb 1101 is brought HIGH. When this happens, dp_slp_mode 1114 assumes the old value of slp_mode 1116, and slp_mode 1116 assumes the old value of slpmode_set 1122.

If the ADC 300 is in fully-powered mode and the user wants to put it into partial power-down mode, then csb 1101 must be taken LOW, and between two and ten serial clock cycles must be supplied before bringing csb back HIGH. On the second clock pulse during the conversion, slpmode_set 1122 will be set to a 1 by SR2 1123 and the glitch reject circuit will be disabled. If csb 1101 is brought HIGH before the 10th SCLK pulse, then dp_slp_mode 1114 will remain unchanged (LOW) and slp_mode 1116 will assume its new HIGH value. When conv_abort_slow 1109 goes HIGH, it releases x13's 1124 output from being held HIGH. The output of x13 1124 will then go LOW causing sleep 1104 to go HIGH. deep_sleep 1105 will still be LOW at this point.

If this process above is repeated, then on the rising edge of latch_mode 1110 the old value of slp_mode 1116 (which was HIGH) will be clocked through to dp_slp_mode 1114, which sets deep_sleep 1105 once conv_abort_slow 1109 has gone HIGH. slp_mode 1116 itself will be HIGH, forcing sleep 1104 HIGH in the same way. If both sleep 1104 and deep_sleep 1105 are HIGH, then all of the analog circuitry will be powered down once csb 1101 returns to a HIGH level.

Taking the ADC 300 out of power-down requires slpmode_set 1122 to be cleared before the conversion is aborted. This is achieved by waiting more than ten SCLK edges in a conversion before bringing csb 1101 HIGH. If csb 1101 is brought HIGH after ten SCLK edges have passed, then slp_mode 1116 will go LOW, which also resets the Q output of x10 1113. Both sleep 1104 and deep_sleep 1105 will stay LOW when conv_abort_slow 1109 goes HIGH, leaving the ADC 300 powered up.

There has been described herein a read-only serial interface used to place an integrated circuit device in a power-down mode. The inventive system demonstrates distinct improvements over the prior art. It will be apparent to those skilled in the art that modifications may be made without departing from the spirit and scope of the invention. Accordingly, it is not intended that the invention be limited except as may be necessary in view of the appended claims.

What is claimed is:

1. A method for placing a device in a reduced power-consumption mode of operation, the method comprising the steps of:
   (a) initializing a device select signal into a first logic state;
   (b) asserting the device select signal in a second logic state; and
   (c) returning the device select signal to the first logic state within a first user-controlled time window.

2. The method in accordance with claim 1, where the step (a) of initializing a device select signal further comprises the step of placing the device select signal into an inactive logic state.

3. The method in accordance with claim 2, wherein the inactive logic state comprises a HIGH logic state.

4. The method in accordance with claim 1, wherein the step (b) of asserting the device select signal further comprises the step of placing the device select signal into an active logic state.

5. The method in accordance with claim 4, wherein the active logic state comprises a LOW logic state.

6. The method in accordance with claim 1, wherein the device includes a clock signal input and the step (c) of returning the device select signal to the first logic state within a first predetermined time window further comprises the step of returning the device select signal to the first logic state after the occurrence of a first transition of the clock signal, but before the occurrence of a second subsequent transition of the clock signal.

7. The method in accordance with claim 6, wherein the first transition of the clock signal comprises the second falling edge of the clock signal that occurs after assertion of the device select signal in a second logic state.

8. The method in accordance with claim 6, wherein the second subsequent transition of the clock signal comprises the tenth falling edge of the clock signal that occurs after assertion of the device select signal in a second logic state.

9. The method in accordance with claim 6, wherein the device is restored to fully-powered operating mode by the additional steps of:

(d) asserting the device select signal in the second logic state; and (e) returning the device select signal to the first logic state within a second predetermined time window.

10. The method in accordance with claim 9, wherein the second predetermined time window is defined by at least ten falling edges of the clock signal.

11. A method for placing an integrated circuit device having a chip select (CS) input and a clock (CLK) input into a reduced power consumption mode of operation, the method comprising the steps of:

(a) controlling the CS input of the device to place the CS input into an initial inactive logic state;

(b) placing the CS input into an active logic state to select the device; and (c) within a first user-controlled time window defined by transitions of the CLK signal, returning the CS input to the initial inactive logic state.

12. The method in accordance with claim 11, wherein the initial inactive logic state is a HIGH logic state.

13. The method in accordance with claim 11, wherein the active logic state is a logic LOW state.

14. The method in accordance with claim 11, wherein the first predetermined time window defined by transitions of the CLK signal comprises a time window beginning with the second falling edge of the CLK signal that occurs after CS is placed in an active logic state, and ending with the tenth subsequent falling edge of the CLK signal that occurs while CS is in the active logic state.

15. The method in accordance with claim 11, wherein the device is restored to fully-powered operating mode by the additional steps of:

(d) placing the CS input into the active logic state to select the device; and (e) within a second predetermined time window defined by transitions of the CLK signal, returning the CS input to the initial inactive logic state.

16. The method in accordance with claim 15, wherein the second predetermined time window is defined by at least ten falling edges of the CLK signal.

17. A device comprising:

means for detecting logic state transitions at a device select input and a clock input; and means for changing operating mode of the device in response to a user-controlled number of logic state transitions at the clock input, occurring between logic state transitions at the device select input.

18. The device of claim 17, wherein the means for detecting logic state transitions at a device select input and a clock input further comprises:

clock divide logic and counter circuitry coupled to the serial clock signal and the device select signal, the clock divide logic and counter circuitry generating intermediate control signals including a first intermediate control signal that occurs after the second falling edge of the serial clock signal and a second intermediate control signal that occurs after the tenth falling edge of the serial clock signal.

19. The device of claim 18, wherein the means for changing operating mode of the device places the device in a reduced power consumption mode of operation in response to a first combination of logic state transitions, and restores the device to fully-powered operation in response to a second combination of logic state transitions.

20. The device of claim 19, wherein the first combination of logic state transitions comprises between two and ten logic state transitions at the clock input, occurring between logic state transitions at the device select input.

21. The device of claim 19, wherein the second combination of logic state transitions comprises at least ten logic state transitions at the clock input, occurring between logic state transitions at the device select input.

22. An analog-to-digital converter comprising:

means for converting an analog input signal into a corresponding digital signal in response to a control signal;

means for outputting the corresponding digital signal in serial form in response to a serial clock signal;

means for generating at least one command signal in response to a user-controlled number of serial clock signal cycles occurring between changing states of the control signal; and means for applying power to selected portions of the analog-to-digital converter in response to the command signal.

23. The analog-to-digital converter of claim 22, wherein the means for converting an analog input signal into a corresponding digital signal further comprises:

a track and hold circuit coupled to the analog input signal; and a successive approximation ADC coupled to the track and hold circuit.

24. The analog-to-digital converter of claim 22, wherein the means for outputting the corresponding digital signal further comprises:

a successive approximation register;

a data multiplexer coupled to the successive approximation register and the serial clock signal; and a serial data output coupled to the data multiplexer.

25. The analog-to-digital converter of claim 22, wherein the means for generating at least one command signal further comprises:

clock divider and counter logic coupled to the serial clock signal and the control signal, wherein the clock divider and counter logic generates a plurality of command signals conditioned, at least in part, by the number of serial clock signal cycles occurring between changing states of the control signal.

26. The analog-to-digital converter of claim 25, wherein the means for applying power to selected portions of the analog-to-digital converter further comprises control and power management logic coupled to the control signal and the clock divider and counter logic.

* * * * *